(12) United States Patent
Kando et al.

(10) Patent No.: US 10,250,227 B2
(45) Date of Patent: Apr. 2, 2019

(54) FREQUENCY-VARIABLE FILTER

(71) Applicant: Murata Manufacturing Co., Ltd., Kyoto (JP)

(72) Inventors: Hajime Kando, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 174 days.

(21) Appl. No.: 15/078,372

(22) Filed: Mar. 23, 2016

(65) Prior Publication Data

US 2016/0211824 A1 Jul. 21, 2016

Related U.S. Application Data

(63) Continuation of application No. PCT/JP2014/074032, filed on Sep. 11, 2014.

(30) Foreign Application Priority Data

Sep. 26, 2013 (JP) .................... 2013-199162

(51) Int. Cl.
*H03H 9/54* (2006.01)
*H03H 7/38* (2006.01)
(Continued)

(52) U.S. Cl.
CPC ............. *H03H 9/542* (2013.01); *H03H 7/38* (2013.01); *H03H 9/0004* (2013.01);
(Continued)

(58) Field of Classification Search
CPC ........ H03H 7/38; H03H 9/0004; H03H 9/542; H03H 9/605; H03H 9/64; H03H 9/6483; H03H 2210/012; H03H 2210/025
(Continued)

(56) References Cited

U.S. PATENT DOCUMENTS

| 6,426,683 B1 | 7/2002 | Gu et al. |
| 7,479,846 B2 | 1/2009 | Inoue et al. |
| (Continued) | | |

FOREIGN PATENT DOCUMENTS

| CN | 1295379 A | 5/2001 |
| CN | 1770628 A | 5/2006 |
| (Continued) | | |

OTHER PUBLICATIONS

Machine English Translation of JPH07-7366 Published on Jan. 10, 1995.*

(Continued)

*Primary Examiner* — Robert J Pascal
*Assistant Examiner* — Jorge L Salazar, Jr.
(74) *Attorney, Agent, or Firm* — Pearne & Gordon LLP

(57) ABSTRACT

A frequency-variable filter includes a filter unit and matching circuits. The filter unit includes frequency-variable resonance circuits that include piezoelectric resonators. The matching circuits have a circuit configuration in which a real number component of an impedance increases as the frequency increases. For example, the matching circuits have an L-type circuit configuration that includes a reactance element connected in shunt to the side of the filter unit and that includes an inductor and a capacitor. As the filter unit includes the piezoelectric resonators, the real number component of the impedance increases as the pass band shifts to a high-frequency side, but the real number component of the impedance increases as the frequency increases in the matching circuits as well. Thus, the impedance matching is achieved.

8 Claims, 9 Drawing Sheets

(51) Int. Cl.
*H03H 9/00* (2006.01)
*H03H 9/60* (2006.01)
*H03H 9/64* (2006.01)

(52) U.S. Cl.
CPC .............. *H03H 9/605* (2013.01); *H03H 9/64* (2013.01); *H03H 9/6483* (2013.01); *H03H 2210/012* (2013.01); *H03H 2210/025* (2013.01)

(58) Field of Classification Search
USPC .................... 333/133, 187, 188, 193–196
See application file for complete search history.

(56) References Cited

U.S. PATENT DOCUMENTS

| | | | |
|---|---|---|---|
| 7,800,461 B2* | 9/2010 | Terada | H03H 9/725 333/133 |
| 8,552,818 B2 | 10/2013 | Kadota et al. | |
| 9,160,306 B2 | 10/2015 | Link et al. | |
| 9,214,920 B2 | 12/2015 | Link et al. | |
| 2001/0052830 A1* | 12/2001 | Noguchi | H03H 9/6483 333/133 |
| 2004/0119562 A1* | 6/2004 | Sakano | H03H 9/0576 333/133 |
| 2005/0212612 A1* | 9/2005 | Kawakubo | H03H 9/542 331/117 R |
| 2006/0091977 A1 | 5/2006 | Inoue et al. | |
| 2006/0232362 A1* | 10/2006 | Frank | H03F 1/223 333/187 |
| 2007/0205849 A1* | 9/2007 | Otis | H03D 3/34 333/187 |
| 2011/0187478 A1 | 8/2011 | Link et al. | |
| 2011/0210805 A1 | 9/2011 | Link et al. | |
| 2012/0286900 A1 | 11/2012 | Kadota et al. | |
| 2015/0130680 A1 | 5/2015 | Link et al. | |

FOREIGN PATENT DOCUMENTS

| | | |
|---|---|---|
| CN | 102725959 A | 10/2012 |
| EP | 110193 A2 | 5/2001 |
| JP | H07-007366 A | 1/1995 |
| JP | 2001-185990 A | 7/2001 |
| JP | 2006-135447 A | 5/2006 |
| JP | 2009-130831 A | 11/2009 |
| JP | 2012-501563 A | 1/2012 |
| WO | 2011093449 A1 | 8/2011 |
| WO | 2012/079038 A2 | 6/2012 |

OTHER PUBLICATIONS

Kristin Foster, "Lecture RF & Microwave Filters", 2010, http://slideplayer.com/slide/11597007 Accessed on Dec. 5, 2017.*
Written Opinion for PCT/JP2014/074032 dated Nov. 9, 2014.
International Search report for PCT/JP2014/074032 dated Nov. 9, 2014.
English translation of Written Opinion for PCT/JP2014/074032 dated Nov. 9, 2014.

* cited by examiner

FREQUENCY-VARIABLE FILTER

BACKGROUND

Technical Field

The present disclosure relates to frequency-variable filters that include piezoelectric resonators and that can vary the filter characteristics.

Conventionally, various high-frequency filters that include a piezoelectric resonator having a resonant frequency and an anti-resonant frequency have been devised. Patent Document 1, for example, describes, as such a high-frequency filter, a frequency-variable filter that allows its filter characteristics, such as the bandpass characteristics and the attenuation characteristics, to vary by connecting variable capacitors in series and in parallel to a piezoelectric resonator.

In such a circuit unit constituted by a piezoelectric resonator and a variable capacitor (hereinafter, referred to as a frequency-variable resonance circuit), the pass band characteristics or the attenuation characteristics are adjusted by adjusting the capacitance of the variable capacitor.

Patent Document 1: Japanese Unexamined Patent Application Publication No. 2009-130831

BRIEF SUMMARY

However, the above-described frequency-variable resonance circuit constituted by a piezoelectric resonator and a variable capacitor shows characteristics such as those illustrated in FIG. 13 when the capacitance of the variable capacitor is varied. FIG. 13 illustrates the changes in the bandpass characteristics of the frequency-variable resonance circuit when the capacitance of the variable capacitor is varied. FIG. 13 illustrates the characteristics shown when the frequency-variable resonance circuit is connected in shunt to a transmission line. A shunt connection refers to a mode of connecting between a ground and a transmission line different from the ground. In addition, FIG. 13 illustrates the characteristics shown in a mode in which an extension inductor has been added to the frequency-variable resonance circuit.

The characteristics indicated by the solid line in FIG. 13 correspond to the case of capacitance C1, the characteristics indicated by the dotted line correspond to the case of capacitance C2, and the characteristics indicated by the dashed line correspond to the case of capacitance C3. The capacitances are in a relation of C3>C2>C1. As illustrated in FIG. 13, as the capacitance is reduced, the resonant frequency and the anti-resonant frequency of the frequency-variable resonance circuit increase. In addition, as the capacitance is reduced, the impedance of the frequency-variable resonance circuit increases across the entire frequency band.

Therefore, even if the impedance of the frequency-variable resonance circuit is set so as to achieve the impedance matching (impedance matching) with an external circuit at the capacitance C3, impedance mismatching occurs between the frequency-variable resonance circuit and the external circuit when the capacitance C3 is changed to the capacitance C1 in order to obtain a desired frequency. In the meantime, even if a matching circuit is configured so as to achieve the impedance matching with an external circuit at the capacitance C1, impedance mismatching occurs between the frequency-variable resonance circuit and the external circuit when the capacitance C3 is changed to the capacitance C1 in order to obtain a desired frequency.

In other words, even if the capacitance is varied within an adjustable frequency range of the frequency-variable resonance circuit and the resonant frequency or the anti-resonant frequency of the frequency-variable resonance circuit is adjusted, the impedance at the resonant frequency or at the anti-resonant frequency deteriorates due to impedance mismatching.

Accordingly, with respect to the adjustable frequency range of a frequency-variable filter constituted by a frequency-variable resonance circuit, or in other words, with respect to the entire range of the desired frequency range to serve as the pass band of the frequency-variable filter, there are a frequency domain in which low-loss pass band characteristics can be achieved and a frequency band in which the low-loss pass band characteristics cannot be achieved. FIG. 14 illustrates the bandpass characteristics (S21 characteristics) of a variable filter that includes the above-described frequency-variable resonance circuit. As in FIG. 13, in FIG. 14, the characteristics indicated by the solid line correspond to the case of the capacitance C1, the characteristics indicated by the dotted line correspond to the case of the capacitance C2, and the characteristics indicated by the dashed line correspond to the case of the capacitance C3. The capacitances are in a relation of C3>C2>C1.

As illustrated in FIG. 14, as the capacitance is reduced, the pass band can be shifted to a high-frequency side. However, when the pass band is shifted to the high-frequency side to a certain extent or more, the insertion loss of the variable filter increases.

Accordingly, the present disclosure is directed to providing a variable filter that can achieve low-loss pass band characteristics regardless of in which frequency domain a pass band is set across the substantially entire adjustable frequency range of a frequency-variable resonance circuit.

A frequency-variable filter according to the present disclosure includes a filter unit that includes a frequency-variable resonance circuit, a plurality of input-output terminals, and a matching circuit. The frequency-variable resonance circuit includes a piezoelectric resonator and a variable capacitor connected to the piezoelectric resonator. The filter unit has a configuration in which at least one frequency-variable resonance circuit is connected in series to a transmission line or connected between a transmission line and a ground. The input-output terminals are connected to both ends of the transmission line. The matching circuit is connected between at least one of the input-output terminals and the filter unit. Furthermore, the matching circuit is constituted by an inductor and a capacitor and has a circuit configuration in which a real number component of a simultaneous conjugate matching impedance increases as a frequency of a high-frequency signal to be transmitted increases.

According to this configuration, when the real number component of the impedance of the frequency-variable resonance circuit increases along with a change in the frequency, the real number component of the simultaneous conjugate matching impedance of the matching circuit also increases, and thus the impedance matching is achieved between the frequency-variable resonance circuit and an external circuit connected to the input-output terminals. Accordingly, the impedance matching can be achieved in a pass band in any frequency domain within a frequency range that can be achieved by the frequency-variable resonance circuit.

In addition, in the frequency-variable filter according to the present disclosure, a frequency change of the real number component of the simultaneous conjugate matching impedance of the matching circuit can be substantially the same as a frequency change of a real number component of a simultaneous conjugate matching impedance of the filter unit.

According to this configuration, the impedance matching can be achieved with higher accuracy in any frequency domain.

In addition, in the frequency-variable filter according to the present disclosure, an adjustment inductor or an adjustment capacitor can be connected between the matching circuit and the filter unit.

According to this configuration, an imaginary number component can be adjusted by the adjustment inductor or the adjustment capacitor, without necessarily changing the real number component. Thus, the impedance matching can be achieved with even higher accuracy.

In addition, the frequency-variable filter according to the present disclosure may have the following configuration.

The frequency-variable filter includes at least one matching circuit constituted by any one of the following circuits.

A first circuit is constituted by a capacitor connected in series to the transmission line and an inductor that connects between the capacitor on the side of the filter unit and the ground.

A second circuit is constituted by an inductor connected in series to the transmission line and a capacitor that connects between the inductor on the side of the filter unit and the ground.

A third circuit is constituted by an inductor and a capacitor each connected between the transmission line and the ground.

According to this configuration, the matching circuit can be implemented with at least two elements, namely, an inductor and a capacitor, and thus the matching circuit can be implemented with a small and simple configuration.

In addition, the frequency-variable filter according to the present disclosure may have the following configuration.

The frequency-variable filter includes at least one matching circuit constituted by any one of the following π-type circuits.

A first π-type circuit is constituted by a first inductor connected in series to the transmission line, a capacitor that connects between the first inductor on the side of the filter unit and the ground, and a second inductor that connects between the first inductor on the side of the input-output terminal and the ground.

A second π-type circuit is constituted by an inductor connected in series to the transmission line and two capacitors that connect respective ends of the inductor to the ground.

A third π-type circuit is constituted by a capacitor connected in series to the transmission line and two inductors that connect respective ends of the capacitor to the ground.

A fourth π-type circuit is constituted by a first capacitor connected in series to the transmission line, an inductor that connects between the first inductor on the side of the filter unit and the ground, and a second capacitor that connects between the first capacitor on the side of the input-output terminal and the ground.

According to this configuration, the matching circuit can be achieved with three elements, namely, a combination of inductors and capacitors, and the change characteristics of the real number component of the simultaneous conjugate matching impedance can be made steeper than those in the case of the two-element configuration. Thus, the impedance matching can be achieved for the impedance characteristics of a larger variety of frequency-variable resonance circuits.

In addition, the frequency-variable filter according to the present disclosure can have the following configuration.

The frequency-variable resonance circuit includes a first variable capacitor connected in series to the piezoelectric resonator and a second variable capacitor connected in parallel to the piezoelectric resonator. Furthermore, the frequency-variable resonance circuit includes at least one of a first inductor for a frequency-variable resonance circuit connected in series between the piezoelectric resonator and the first variable capacitor and a second inductor for a frequency-variable resonance circuit connected in parallel to the piezoelectric resonator.

According to this configuration, the variable frequency range of the frequency-variable resonance circuit can be broadened. Furthermore, even when the variable frequency range is broadened in this manner, the impedance matching can be achieved with high accuracy in any frequency domain.

According to the present disclosure, low-loss pass band characteristics can be achieved regardless of in which frequency domain a pass band is set across the substantially entire adjustable frequency range of a frequency-variable filter constituted by a frequency-variable resonance circuit.

DETAILED DESCRIPTION

Figure 1:
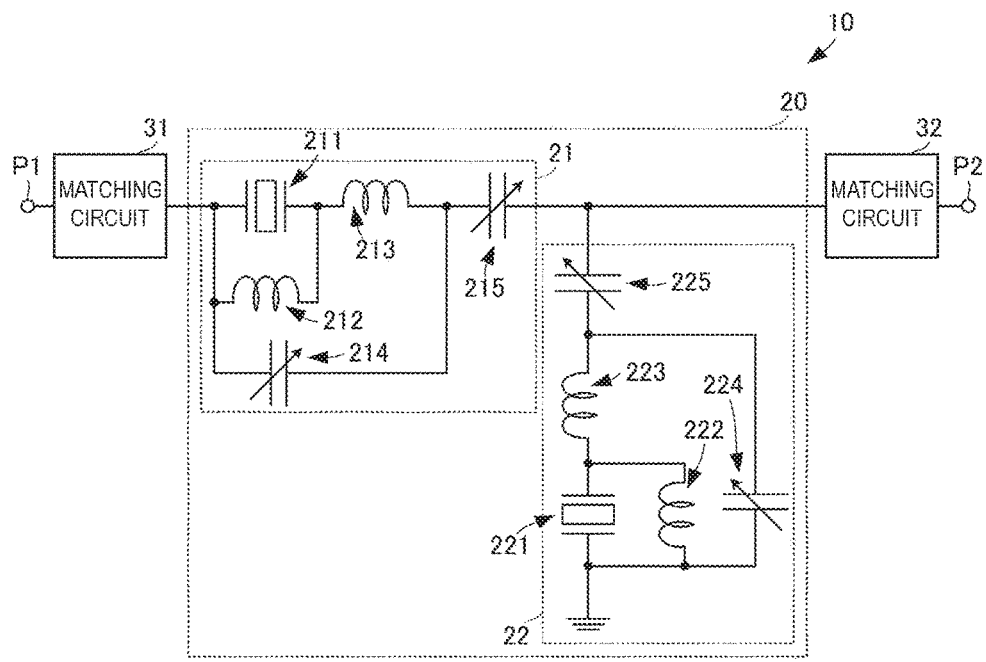
FIG. 1 is a circuit diagram of a frequency-variable filter according to a first embodiment of the present disclosure.

A frequency-variable filter according to a first embodiment of the present disclosure will be described with reference to the drawings. FIG. 1 is a circuit diagram of the frequency-variable filter according to the first embodiment of the present disclosure.

As illustrated in FIG. 1, a frequency-variable filter 10 includes a filter unit 20, matching circuits 31 and 32, and input-output terminals P1 and P2.

The filter unit 20 is connected to the input-output terminal P1 with the matching circuit 31 interposed therebetween and connected to the input-output terminal P2 with the matching circuit 32 interposed therebetween.

The filter unit 20 includes frequency-variable resonance circuits 21 and 22. The frequency-variable resonance circuit 21 is connected between the matching circuits 31 and 32. In other words, the frequency-variable resonance circuit 21 is connected in series to a transmission line. The frequency-variable resonance circuit 22 is connected between the transmission line that connects the frequency-variable resonance circuit 21 with the matching circuit 32 and a ground. In other words, the frequency-variable resonance circuit 22 is connected in shunt to the transmission line.

The frequency-variable resonance circuit 21 includes a piezoelectric resonator 211, inductors 212 and 213, and variable capacitors 214 and 215. The piezoelectric resonator 211, the inductor 213, and the variable capacitor 215 are connected in series between the matching circuits 31 and 32. Here, the piezoelectric resonator 211, the inductor 213, and the variable capacitor 215 are connected in this order from the side of the matching circuit 31. The inductor 212 is connected in parallel to the piezoelectric resonator 211. The variable capacitor 214 is connected in parallel to a series circuit of the piezoelectric resonator 211 and the inductor 213.

The frequency-variable resonance circuit 22 includes a piezoelectric resonator 221, inductors 222 and 223, and variable capacitors 224 and 225. The piezoelectric resonator 221, the inductor 223, and the variable capacitor 225 are connected in series between the transmission line and the ground. Here, the piezoelectric resonator 221, the inductor 223, and the variable capacitor 225 are connected in this order from the side of the ground. The inductor 222 is connected in parallel to the piezoelectric resonator 221. The variable capacitor 224 is connected in parallel to a series circuit of the piezoelectric resonator 221 and the inductor 223.

The piezoelectric resonators 211 and 221 are implemented by SAW resonators or BAW resonators. For example, when SAW resonators are used, the piezoelectric resonators 211 and 221 are each implemented by forming an interdigital transducer (IDT) electrode on a surface of a lithium niobate substrate of a predetermined cut (e.g., Y-cut).

The inductors 212, 213, 222, and 223 are implemented, for example, by electrode patterns formed on a mount board on which the piezoelectric resonators 211 and 221 are mounted or by chip components mounted on a surface of the mount board. The variable capacitors 214, 215, 224, and 225 are implemented, for example, by chip components mounted on the surface of the mount board on which the piezoelectric resonators 211 and 221 are mounted.

With the above-described configuration, the impedance characteristics of the frequency-variable resonance circuit 21, or in other words, its bandpass characteristics or attenuation characteristics are adjusted by adjusting the capacitances of the variable capacitors 214 and 215. In addition, the filter characteristics of the frequency-variable resonance circuit 22, or in other words, its bandpass characteristics or attenuation characteristics are adjusted by adjusting the capacitances of the variable capacitors 224 and 225. By combining the impedance characteristics of the frequency-variable resonance circuits 21 and 22 adjusted as described above, filter characteristics (bandpass characteristics, attenuation characteristics, etc.) desired for the filter unit 20 are achieved.

The inductors 212, 213, 222, and 223 are so-called extension inductors and can be omitted. When the inductors 212, 213, 222, and 223 are provided, the band width of the pass band of the frequency-variable filter that the frequency-variable resonance circuits 21 and 22 can adjust by adjusting the capacitances of the variable capacitors 214, 215, 224, and 225 can be broadened. In other words, when the inductors 212, 213, 222, and 223 are provided, the selectable frequency range of the pass band of the frequency-variable filter obtained by adjusting the frequency-variable resonance circuits 21 and 22 can be broadened. Thus, the selectable frequency range of the pass band of the filter unit 20 can be broadened.

Figure 2:
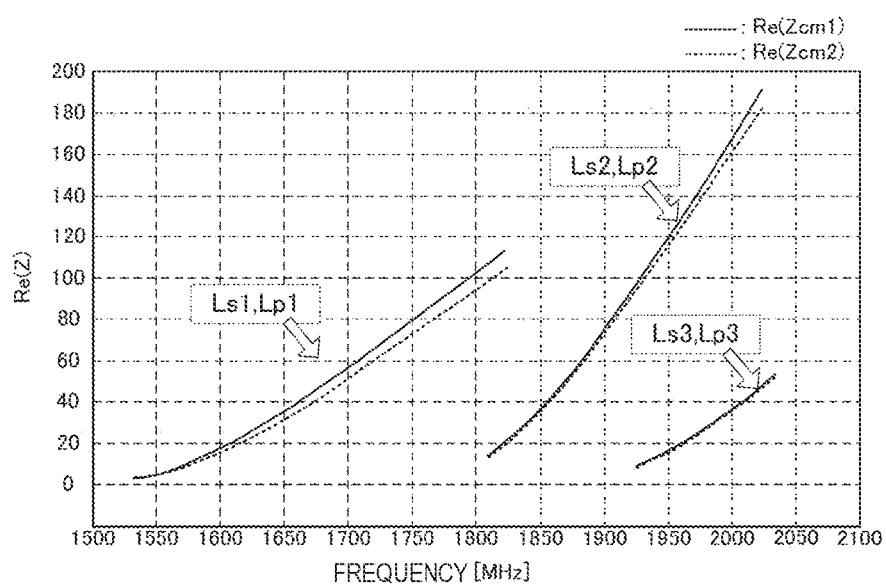
FIG. 2 illustrates the frequency characteristics of a real number component of an impedance at a center frequency of a pass band of a frequency-variable filter according to the present embodiment.

The filter unit 20 configured as described above includes the piezoelectric resonators 211 and 221, and thus the real number component of the impedance increases when the frequency of the pass band is shifted to a high-frequency side. FIG. 2 illustrates the frequency characteristics of the real number component of the impedance at a center frequency of the pass band of the frequency-variable filter according to the present embodiment. In FIG. 2, the solid lines indicate the impedance of the filter unit seen from the side of the input-output terminal P1 (the side of the matching circuit 31), and the dashed lines indicate the impedance of the filter unit seen from the side of the input-output terminal P2 (the side of the matching circuit 32). The horizontal axis in FIG. 2 represents the center frequency of the pass band, and the vertical axis represents the real number component of the impedance. FIG. 2 illustrates a plurality of characteristic curves, and the characteristic curves differ from one another in terms of the inductances of the extension inductors.

As illustrated in FIG. 2, in the filter unit 20, the real number component of the impedance increases as the frequency of the pass band increases if the inductances of the extension inductors stay constant.

Therefore, the frequency-variable filter 10 according to the present embodiment includes the matching circuits 31 and 32 each having a configuration described below. The matching circuits 31 and 32 each have a circuit configuration that includes a combination of an inductor and a capacitor, and have a pattern in which circuit elements are arranged symmetrically with respect to the filter unit 20. The matching circuits 31 and 32 each can be constituted by two elements or by three elements. However, the matching circuits 31 and 32 may have a circuit configuration in which, with the two-element or three-element circuit configuration serving as a basic configuration, and such basic configurations are repeated.

(A) Case of Two-Element Configuration (Basic Circuit Configuration Includes Two Elements)

Figure 3A:
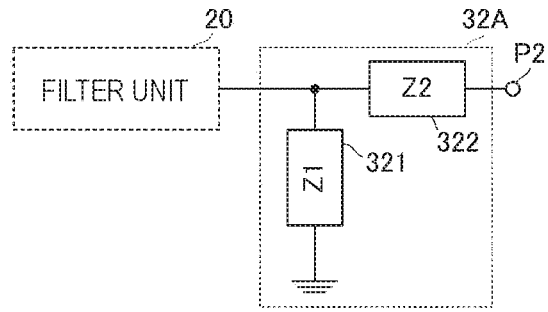
FIGS. 3A-3D illustrate circuit diagrams of two-element matching circuits according to an embodiment of the present disclosure.
Figure 3B:
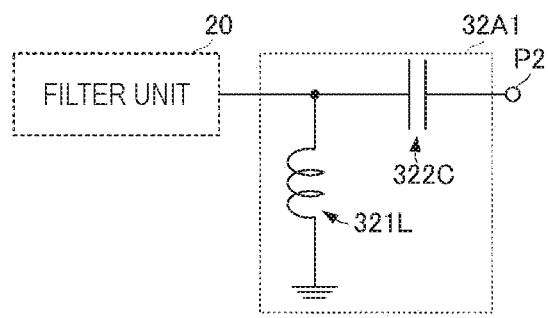
Figure 3C:
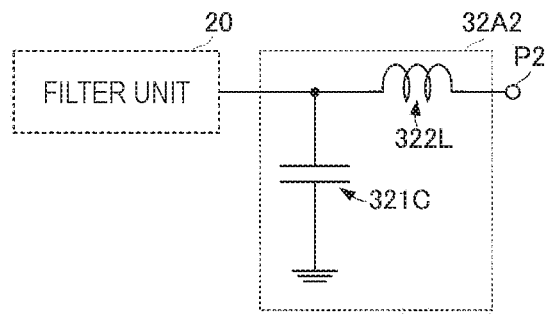
Figure 3D:
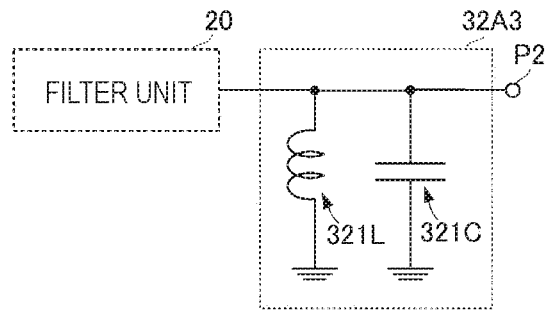

FIGS. 3A-3D illustrate circuit diagrams of two-element matching circuits according to an embodiment of the present disclosure. FIG. 3A is a basic block diagram of a matching circuit, FIGS. 3B and 3C illustrate specific circuit examples, and FIG. 3D illustrates another circuit block of a matching circuit. FIGS. 3A-3D illustrate circuit configurations of the matching circuit 32 (32A). As described above, since the matching circuit 31 has a circuit configuration that is symmetric to the circuit configuration of the matching circuit 32 with respect to the filter unit 20, only the matching circuit 32 will be described.

As illustrated in FIG. 3A, the matching circuit 32A includes reactance elements 321 and 322. The reactance element 321 is connected between the transmission line that connects the filter unit 20 with the input-output terminal P2 and the ground. In other words, the reactance element 321 is connected in shunt to the transmission line that connects the filter unit 20 with the input-output terminal P2. The reactance element 322 is connected in series between the filter unit 20 and the input-output terminal P2. In other words, the reactance element 322 is connected in series to the transmission line. Here, the reactance element 322 is connected between a node at which the reactance element 321 connects to the transmission line and the input-output terminal P2.

As a specific first example, as illustrated in FIG. 3B, in a matching circuit 32A1, the reactance element 321 is an inductor 321L, and the reactance element 322 is a capacitor 322C.

In addition, as a specific second example, as illustrated in FIG. 3C, in a matching circuit 32A2, the reactance element 321 is a capacitor 321C, and the reactance element 322 is an inductor 322L.

Furthermore, as illustrated in FIG. 3D, in a matching circuit 32A3, a first reactance element constituted by an inductor 321L and a second reactance element constituted by a capacitor 321C may be connected between the transmission line that connects the filter unit 20 with the input-output terminal P2 and the ground. In other words, a parallel circuit of the inductor 321L and the capacitor 321C may be connected in shunt to the transmission line that connects the filter unit 20 with the input-output terminal P2.

Figure 4:
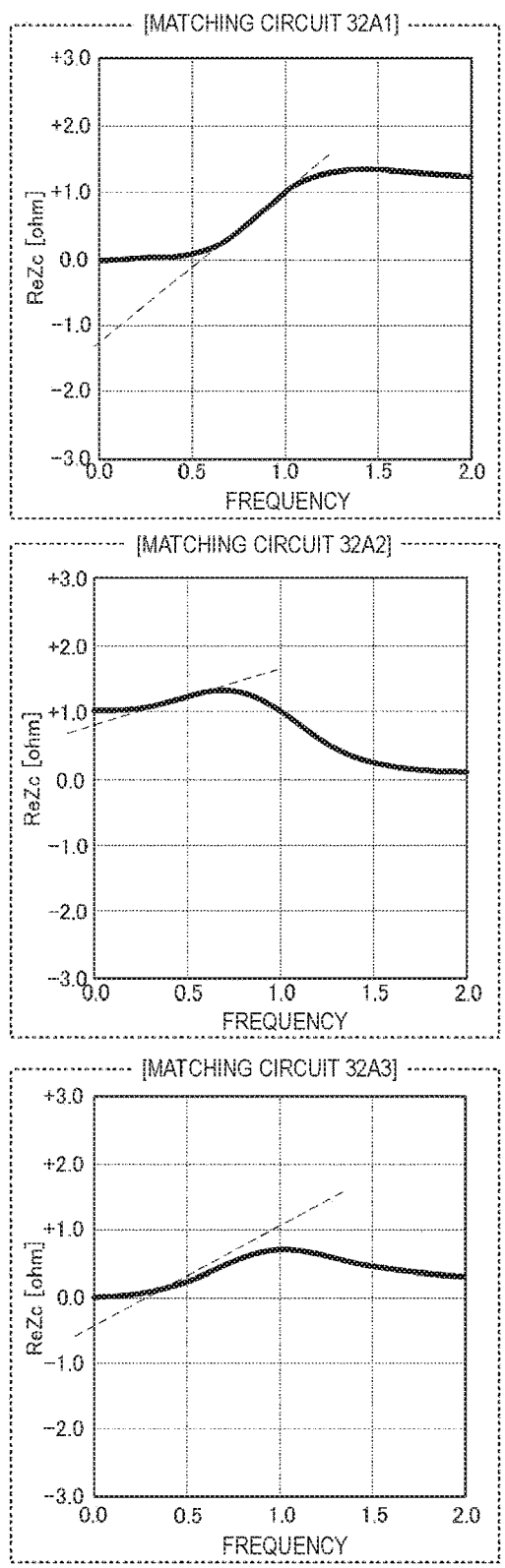
FIG. 4 illustrates the frequency characteristics of a real number component of an impedance of a two-element matching circuit that includes an inductor and a capacitor.

FIG. 4 illustrates the frequency characteristics of the real number component of the impedance of the two-element matching circuit that includes an inductor and a capacitor. FIG. 4 illustrates the characteristics of the matching circuit 32A1 illustrated in FIG. 3B, the characteristics of the matching circuit 32A2 illustrated in FIG. 3C, and the characteristics of a matching circuit having another circuit configuration. The horizontal axis in FIG. 4 represents the normalized frequency, and a specific frequency is set to 1.0. The vertical axis in FIG. 4 represents an impedance real number component when the matching circuit is seen from the input-output terminal P2 in a state in which a load having an impedance of 1 [ohm] is connected.

As illustrated in FIG. 4, the following characteristics are obtained by using the matching circuits 32A1, 32A2, and 32A3 illustrated, respectively, in FIGS. 3B, 3C, and 3D.

(A) There is a frequency segment in which the real number component of the impedance increases as the frequency shifts to the high-frequency side.

(B) When the frequency characteristics are linearly approximated in the frequency segment in which the real number component of the impedance increases, the real number component of the impedance at a frequency of 0 is not 0.

The above configuration makes it possible to achieve characteristics similar to the frequency characteristics of the real number component of the impedance of the filter unit 20 with the matching circuit.

In other words, with an L-type circuit that includes reactance elements connected in shunt to the side of the filter unit 20 and that has a configuration in which one of the two reactance elements is an inductor and the other reactance element is a capacitor, characteristics similar to the frequency characteristics of the real number component of the impedance of the filter unit 20 can be achieved.

Figure 5:
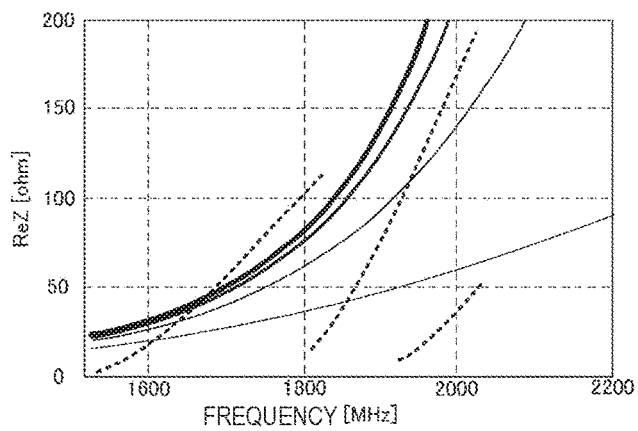
FIG. 5 illustrates the frequency characteristics of a real number component of an impedance of a filter unit and a matching circuit of a frequency-variable filter according to an embodiment of the present disclosure.

FIG. 5 illustrates the frequency characteristics of the real number component of the impedance of the filter unit and the matching circuit of the frequency-variable filter according to an embodiment of the present disclosure. The solid lines in FIG. 5 indicate the characteristics of the respective modes in which the element values of the matching circuit differ. The dashed lines in FIG. 5 indicate the characteristics of filter units that differ in terms of the extension inductors.

As illustrated in FIG. 5, by adjusting the element values of the matching circuits 32A1 and 32A2, the frequency characteristics of the real number component of the impedance that are similar to the tendency of the change in the real number component of the impedance at the center frequency of the pass band of the frequency-variable filter when the bandpass characteristics of the filter unit 20 is made variable can be set. Thus, in the matching circuits 32A1 and 32A2, the conjugate matching impedance can be achieved with respect to the impedance of the filter unit 20. Then, by connecting the matching circuits 32 and 31 having symmetric circuit configurations to the input-output ends of the filter unit 20, the simultaneous conjugate matching impedance can be achieved with the matching circuits 32 and 31 with respect to the impedance of the filter unit 20.

Thus, even if the impedance of the filter unit 20 changes depending on the frequency, the impedance matching can be achieved with the matching circuits 31 and 32, and the frequency-variable filter 10 with excellent filter characteristics can be achieved even when another circuit element is connected to the frequency-variable filter.

Figure 6A:
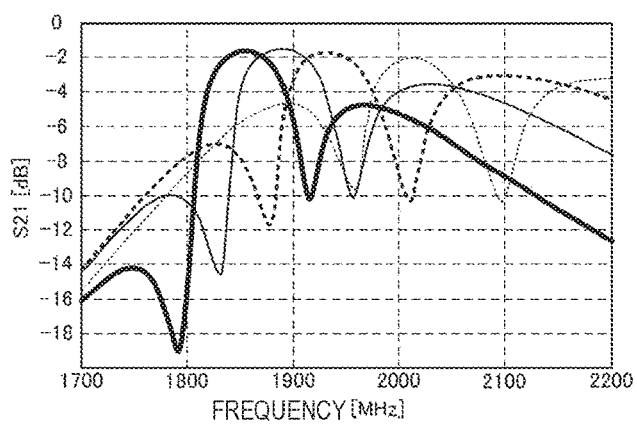
FIGS. 6A and 6B illustrate the bandpass characteristics of a frequency-variable filter that includes an L-type matching circuit according to an embodiment of the present disclosure and the bandpass characteristics of a conventional frequency-variable filter that does not include a matching circuit.
Figure 6B:
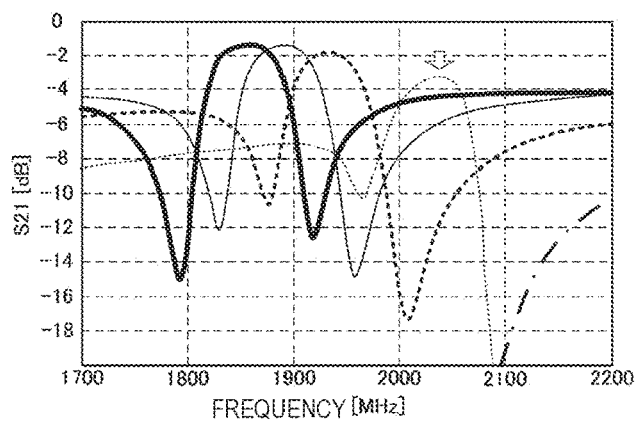

FIG. 6A illustrates the bandpass characteristics of the frequency-variable filter that includes an L-type matching circuit according to an embodiment of the present disclosure, and FIG. 6B illustrates the bandpass characteristics of a conventional frequency-variable filter that does not include a matching circuit.

As illustrated in FIG. 6B, with a conventional configuration, insertion loss increases when the frequency of the pass band shifts to the high-frequency side. This is due to the frequency characteristics of the real number component of the impedance of the filter unit described above.

However, by employing the configuration of the present embodiment, the impedance matching can be achieved with the matching circuit even when the impedance of the filter unit changes. Accordingly, as illustrated in FIG. 6A, insertion loss can be prevented from increasing even when the frequency of the pass band of the frequency-variable filter 10 is shifted to the high-frequency side. Thus, low-loss bandpass characteristics can be achieved in any pass band that can be achieved by the frequency-variable filter 10.

The above-described configuration makes it easier to substantially match the real number component of the impedance and makes it possible to achieve the impedance matching. However, the above-described configuration alone may not be able to match an imaginary number component. In this case, by additionally providing an inductor or a capacitor to be connected in series to the transmission line, only the imaginary number component can be shifted, and thus the impedance matching can be achieved with higher accuracy. Such inductor or capacitor corresponds to an adjustment inductor or an adjustment capacitor according to the present disclosure.

In addition, a mode of using an L-type two-element matching circuit makes it possible to reduce the number of constituting elements of the matching circuit, and thus a simple and small-size matching circuit can be achieved, and a simple and small-size frequency-variable filter can be achieved in turn.

(B) Case of Three-Element π-Type Circuit (Basic Circuit Configuration Includes Three Elements)

Figure 7A:
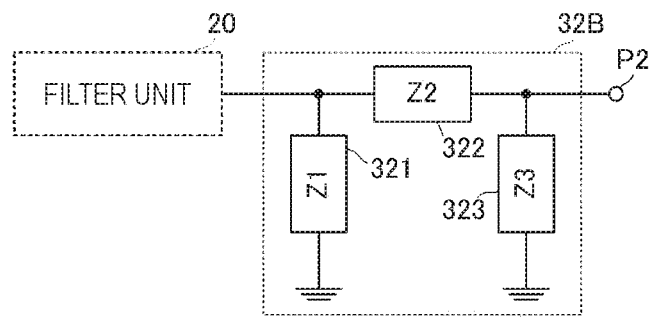
FIGS. 7A-7E illustrate circuit diagrams of three-element π-type matching circuits according to an embodiment of the present disclosure.

FIGS. 7A-7E illustrates circuit diagrams of three-element π-type matching circuits according to an embodiment of the present disclosure. FIG. 7A is a basic block diagram of a matching circuit, and FIGS. 7B, 7C, 7D, and 7E illustrate specific circuit examples. FIG. 7 also illustrates a circuit configuration of the matching circuit 32 (32B). As described above, since the matching circuit 31 has a circuit configuration that is symmetric to the circuit configuration of the matching circuit 32 with respect to the filter unit 20, only the matching circuit 32 will be described.

As illustrated in FIG. 7A, the matching circuit 32B includes reactance elements 321, 322, and 323. The reactance elements 321 and 323 are connected between the transmission line that connects the filter unit 20 with the input-output terminal P2 and the ground. In other words, the reactance elements 321 and 323 are connected in shunt to the transmission line that connects the filter unit 20 with the input-output terminal P2. The reactance element 322 is connected in series between the filter circuit 20 and the input-output terminal P2. In other words, the reactance element 322 is connected in series to the transmission line. Here, the reactance element 322 is connected between a node at which the reactance element 321 connects to the transmission line and a node at which the reactance element 323 connects to the transmission line. In this manner, the matching circuit 32B is a π-type circuit.

Figure 7B:
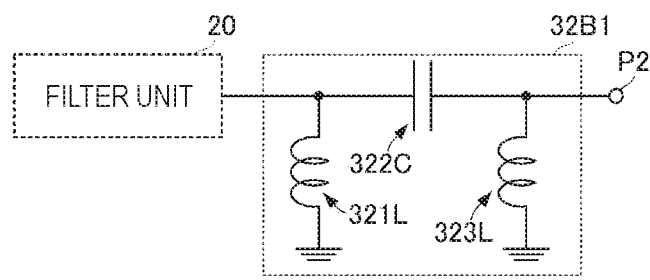

As a specific first example, as illustrated in FIG. 7B, in a matching circuit 32B1, the reactance element 321 is an inductor 321L, the reactance element 322 is a capacitor 322C, and the reactance element 323 is an inductor 323L.

Figure 7C:
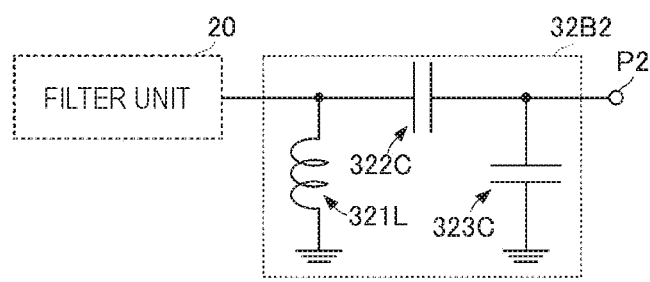

As a specific second example, as illustrated in FIG. 7C, in a matching circuit 32B2, the reactance element 321 is an inductor 321L, the reactance element 322 is a capacitor 322C, and the reactance element 323 is a capacitor 323C.

Figure 7D:
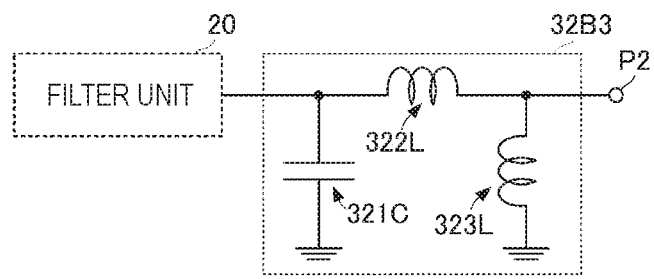

As a specific third example, as illustrated in FIG. 7D, in a matching circuit 32B3, the reactance element 321 is a capacitor 321C, the reactance element 322 is an inductor 322L, and the reactance element 323 is an inductor 323L.

Figure 7E:
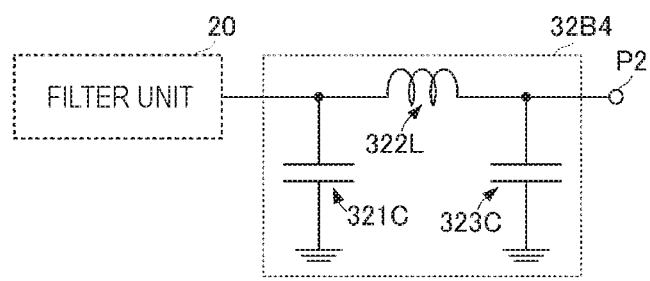

As a specific fourth example, as illustrated in FIG. 7E, in a matching circuit 32B4, the reactance element 321 is a capacitor 321C, the reactance element 322 is an inductor 322L, and the reactance element 323 is a capacitor 323C.

Figure 8:
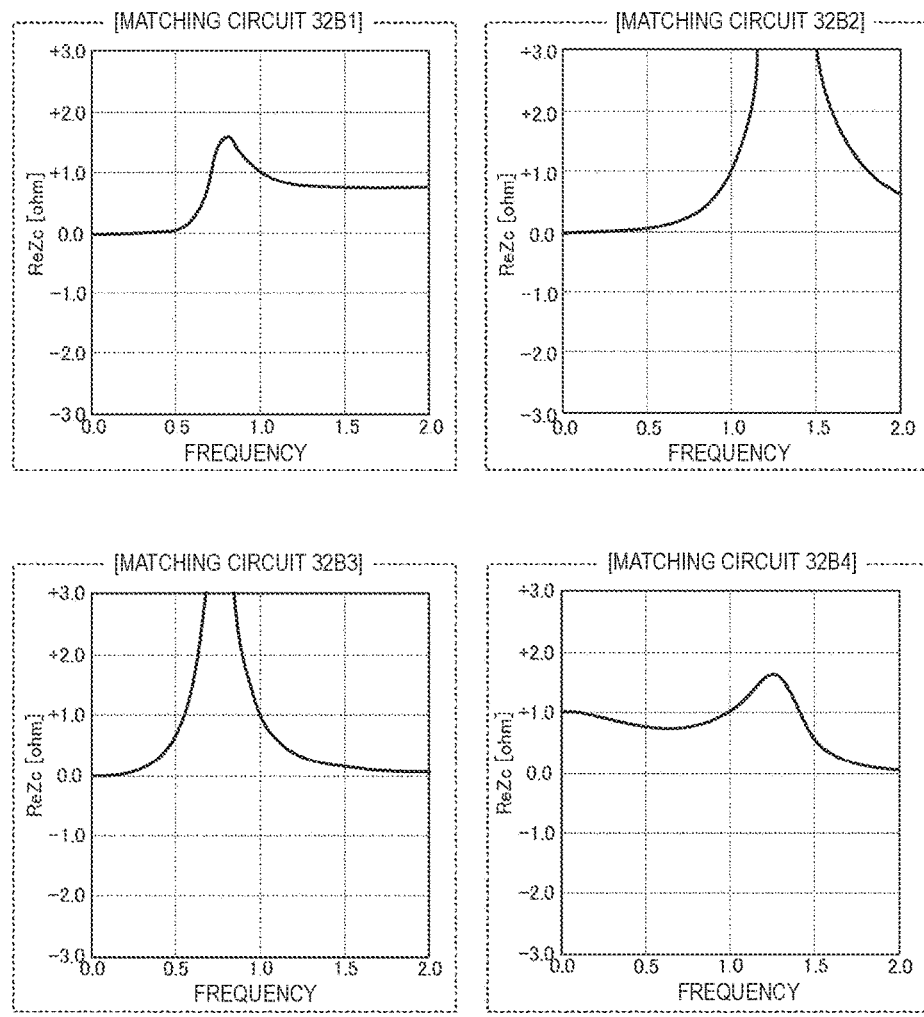
FIG. 8 illustrates the frequency characteristics of a real number component of an impedance of a three-element matching circuit that includes an inductor and a capacitor.

FIG. 8 illustrates the frequency characteristics of the real number component of the impedance of a three-element matching circuit that includes an inductor and a capacitor. FIG. 8 illustrates the characteristics of the matching circuits 32B1, 32B2, 32B3, and 32B4 illustrated, respectively, in FIGS. 7B to 7E. The horizontal axis in FIG. 8 represents the normalized frequency, and a specific frequency is set to 1.0. The vertical axis in FIG. 8 represents an impedance real number component when the matching circuit is seen in a state in which a load having an impedance of 1 [ohm] is connected.

As illustrated in FIG. 8, by using the matching circuits 32B1, 32B2, 32B3, and 32B4 illustrated in FIGS. 7B to 7E, the frequency characteristics of the real number component of the impedance indicated in the characteristics (A) and (B) of the two-element circuit described above can be obtained.

The above configuration makes it possible to achieve characteristics similar to the frequency characteristics of the real number component of the impedance of the filter unit 20 with the matching circuit.

Furthermore, with the matching circuits 32B1, 32B2, 32B3, and 32B4 of the three-element π-type circuit, as illustrated in FIG. 8, the characteristics in which the real number component of the impedance increases steeply can be achieved. The impedance of a piezoelectric resonator changes quickly between the resonant frequency and the anti-resonant frequency. In other words, the change in the impedance between the pass band and the attenuation pole is steep. Accordingly, with the use of the matching circuits 32B1, 32B2, 32B3, and 32B4 of the three-element π-type circuit, characteristics similar to the frequency characteristics of the real number component of the impedance of the filter unit 20 can be achieved more easily.

Figure 9:
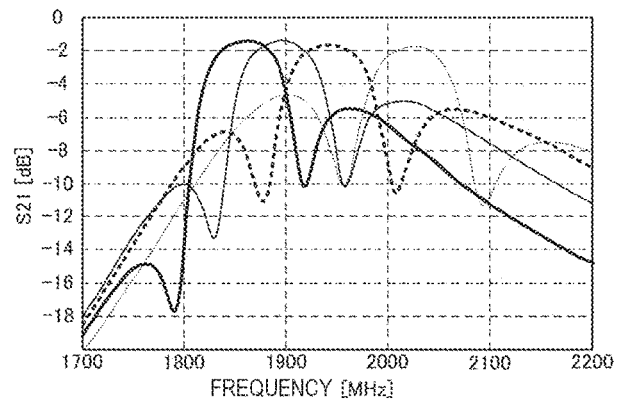
FIG. 9 illustrates the bandpass characteristics of a frequency-variable filter that includes a π-type matching circuit according to an embodiment of the present disclosure.

FIG. 9 illustrates the bandpass characteristics of a frequency-variable filter that includes a π-type matching circuit according to an embodiment of the present disclosure. As illustrated in FIG. 9, by employing the configuration of the present embodiment, the impedance matching can be achieved with the matching circuit even when the impedance of the filter unit changes. Accordingly, for example, insertion loss can be prevented from increasing excessively even when the frequency of the pass band of the frequency-variable filter 10 is shifted to the high-frequency side. Thus, low-loss bandpass characteristics can be achieved in any pass band that can be achieved by the frequency-variable filter 10.

The above-described configuration makes it easier to substantially match the real number component of the impedance and makes it possible to achieve the impedance matching. However, even with the above-described π-type circuit configuration, the imaginary number component may not be matched. In this case, as in the above-described L-type circuit, by additionally providing an inductor or a capacitor to be connected in series to the transmission line on the side of the filter unit 20, the imaginary number component alone can be shifted, and thus the impedance matching can be achieved with higher accuracy.

(C) Case of Three-Element T-Type Circuit (Basic Circuit Configuration Includes Three Elements)

Figure 10A:
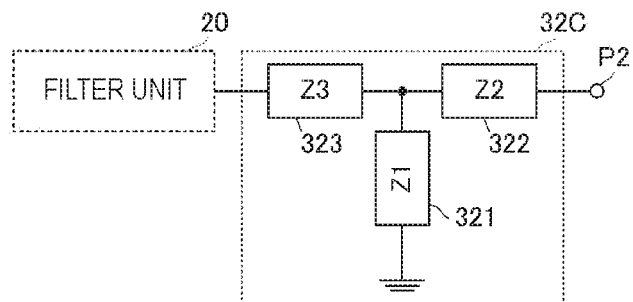
FIGS. 10A-10E illustrate circuit diagrams of three-element T-type matching circuits according to an embodiment of the present disclosure.

FIGS. 10A-10E illustrate circuit diagrams of three-element T-type matching circuits according to an embodiment of the present disclosure. FIG. 10A is a basic block diagram of a matching circuit, and FIGS. 10B, 10C, 10D, and 10E illustrate specific circuit examples. FIGS. 10A-10E also illustrate a circuit configuration of the matching circuit 32 (32C). As described above, since the matching circuit 31 has a circuit configuration that is symmetric to the circuit configuration of the matching circuit 32 with respect to the filter unit 20, only the matching circuit 32 will be described.

As illustrated in FIG. 10A, the matching circuit 32C includes reactance elements 321, 322, and 323. The reactance element 321 is connected between the transmission line that connects the filter unit 20 with the input-output terminal P2 and the ground. In other words, the reactance element 321 is connected in shunt to the transmission line that connects the filter unit 20 with the input-output terminal P2. The reactance elements 322 and 323 are connected in series between the filter unit 20 and the input-output terminal P2. In other words, the reactance elements 322 and 323 are connected in series to the transmission line. Here, the reactance element 322 is connected between a node at which the reactance element 321 connects to the transmission line and the input-output terminal P2. The reactance element 323 is connected between the node at which the reactance element 321 connects to the transmission line and the filter unit 20. In this manner, the matching circuit 32C is a T-type circuit.

Figure 10B:
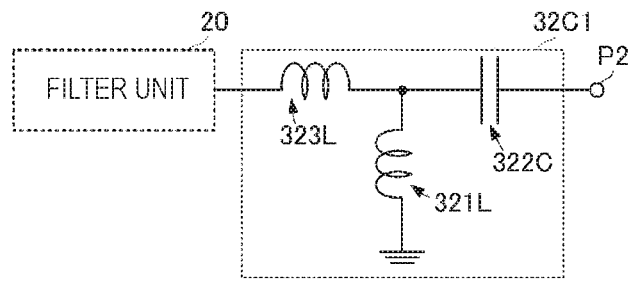

As a specific first example, as illustrated in FIG. 10B, in a matching circuit 32C1, the reactance element 321 is an inductor 321L, the reactance element 322 is a capacitor 322C, and the reactance element 323 is an inductor 323L.

Figure 10C:
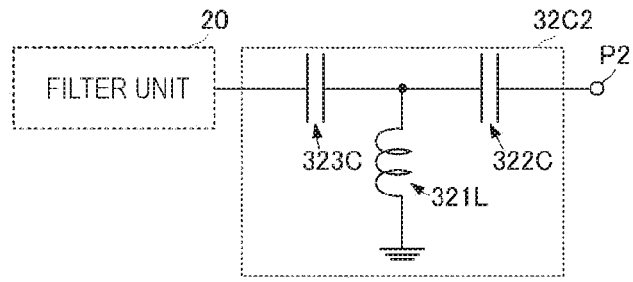

As a specific second example, as illustrated in FIG. 10C, in a matching circuit 32C2, the reactance element 321 is an inductor 321L, the reactance element 322 is a capacitor 322C, and the reactance element 323 is a capacitor 323C.

Figure 10D:
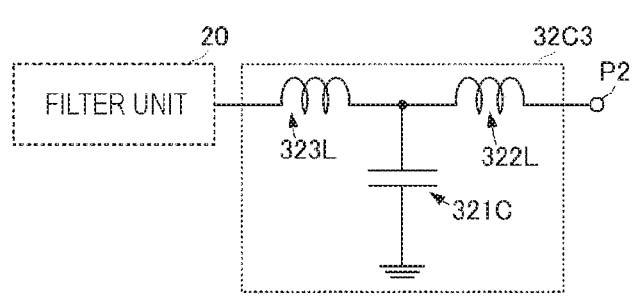

As a specific third example, as illustrated in FIG. 10D, in a matching circuit 32C3, the reactance element 321 is a capacitor 321C, the reactance element 322 is an inductor 322L, and the reactance element 323 is an inductor 323L.

Figure 10E:
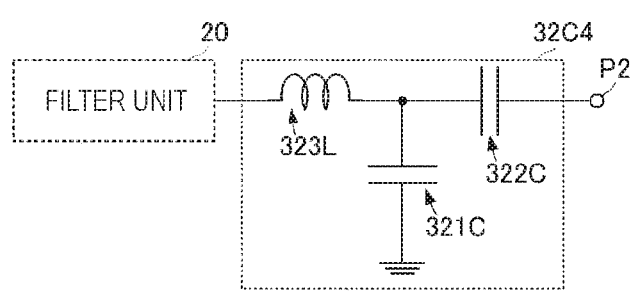

As a specific fourth example, as illustrated in FIG. 10E, in a matching circuit 32C4, the reactance element 321 is a capacitor 321C, the reactance element 322 is a capacitor 322C, and the reactance element 323 is an inductor 323L.

With these configurations as well, as in the matching circuit 32B of the π-type circuit, the impedance matching can be achieved with respect to the filter unit 20 even when the frequency of the pass band changes.

Figure 11:
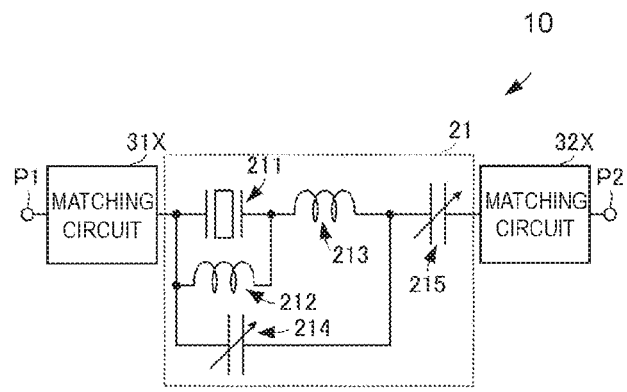
FIG. 11 is a circuit diagram illustrating another configuration example of a filter unit of a frequency-variable filter according to an embodiment of the present disclosure.

In the above-described embodiments, an example in which the filter unit 20 is constituted by the frequency-variable resonance circuit 21 connected in series to the transmission line and the frequency-variable resonance circuit 22 connected in shunt to the transmission line is illustrated. Alternatively, the filter unit may be implemented with the configuration illustrated in FIG. 11. FIG. 11 is a circuit diagram illustrating another configuration example of a filter unit of a frequency-variable filter according to an embodiment of the present disclosure.

As illustrated in FIG. 11, the filter unit of a frequency-variable filter 10X is constituted by the above-described frequency-variable resonance circuit 21 alone. In other words, the filter unit is constituted by the frequency-variable resonance circuit 21 alone connected in series between the input-output terminals P1 and P2. A matching circuit 31X is connected between the input-output terminal P1 and the frequency-variable resonance circuit 21, and a matching circuit 32X is connected between the input-output terminal P2 and the frequency-variable resonance circuit 21. With such a configuration as well, as in the matching circuits 31 and 32, the matching circuits 31X and 32X are configured so as to satisfy the condition for the characteristics (A) and (B) of the above-described two-element circuit. Thus, low-loss bandpass characteristics can be achieved in any pass band that can be achieved by the frequency-variable filter 10X.

Figure 12A:
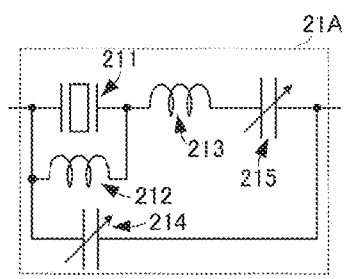
FIGS. 12A-12C illustrate circuit configuration examples of a frequency-variable resonance circuit according to an embodiment of the present disclosure.
Figure 12B:
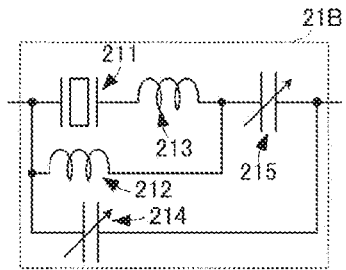
Figure 12C:
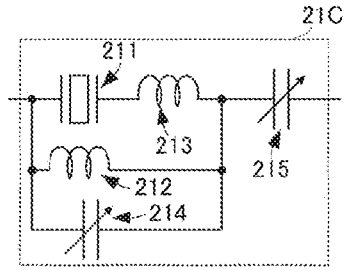
Figure 13:
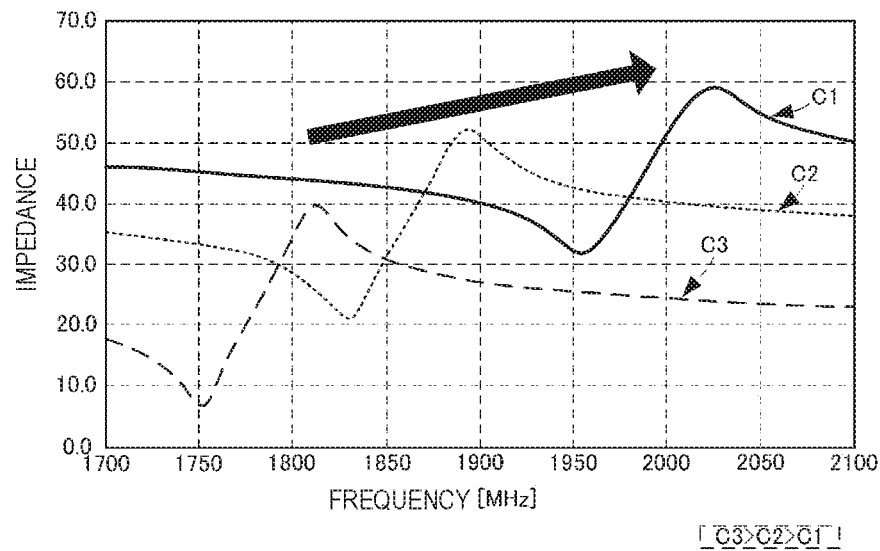
FIG. 13 illustrates a change in the bandpass characteristics of a frequency-variable resonance circuit when the capacitance of a variable capacitor is varied.
Figure 14:
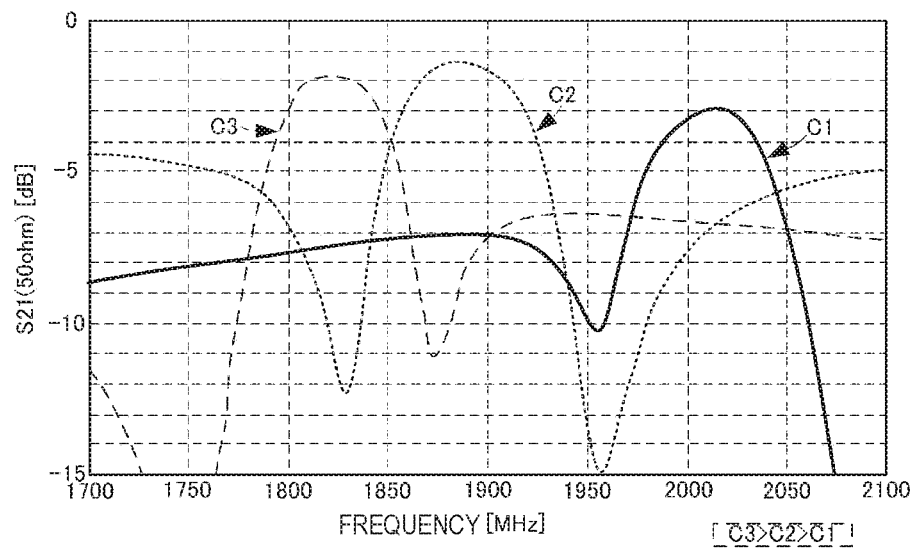
FIG. 14 illustrates the bandpass characteristics (S21 characteristics) of a frequency-variable filter that includes a conventional frequency-variable resonance circuit.

In addition, the configuration of the frequency-variable resonance circuit is not limited to the above-described configuration and may be configurations illustrated in FIGS. 12A, 12B, and 12C. FIGS. 12A-12C illustrate circuit configuration examples of a frequency-variable resonance circuit according to an embodiment of the present disclosure. FIGS. 12A-12C illustrate variation examples of the frequency-variable resonance circuit 21, and the same variation examples can be implemented in the frequency-variable resonance circuit 22 as well. In addition, the frequency-variable resonance circuits 21 and 22 do not need to have the same circuit configuration, and the filter unit can be constituted through any appropriate combinations including the variation examples.

In a frequency-variable resonance circuit 21A illustrated in FIG. 12A, the variable capacitor 214 is connected in parallel to a series circuit of the piezoelectric resonator 211, the inductor 213, and the variable capacitor 215. Other configurations are the same as those of the frequency-variable resonance circuit 21.

In a frequency-variable resonance circuit 21B illustrated in FIG. 12B, the inductor 212 is connected in parallel to a series circuit of the piezoelectric resonator 211 and the inductor 213. Other configurations are the same as those of the frequency-variable resonance circuit 21A.

In a frequency-variable resonance circuit 21C illustrated in FIG. 12C, the inductor 212 is connected in parallel to a series circuit of the piezoelectric resonator 211 and the inductor 213. Other configurations are the same as those of the frequency-variable resonance circuit 21.

REFERENCE SIGNS LIST 10, 10X FREQUENCY-VARIABLE FILTER
20 FILTER UNIT
21, 22, 21A, 21B, 21C FREQUENCY-VARIABLE RESONANCE CIRCUIT
211, 221 PIEZOELECTRIC RESONATOR
212, 213, 222, 223 INDUCTOR (EXTENSION INDUCTOR)
214, 215, 224, 225 VARIABLE CAPACITOR
31, 32, 32A, 32A1, 32A2, 32A3, 31X, 32X MATCHING CIRCUIT
321, 322, 323 REACTANCE ELEMENT
321L, 322L, 323L INDUCTOR
321C, 322C, 323C CAPACITOR

The invention claimed is:

1. A frequency-variable filter, comprising:
a first input-output terminal;
a second input-output terminal;
a filter unit, connected to between the first input-output terminal and the second input-output terminal, including a frequency-variable resonance circuit, the frequency-variable resonance circuit including a piezoelectric resonator and a first variable capacitor connected to the piezoelectric resonator;
a first matching circuit connected between the first input-output terminal and the filter unit, and
a second matching circuit connected between the second input-output terminal and the filter unit,
wherein the first matching circuit comprises a first circuit element and a second circuit element, and
the first circuit element is one of a capacitor and an inductor,
the second circuit element is the other of the capacitor and the inductor,
the first matching circuit and the second matching circuit each have a pattern in which circuit elements are arranged symmetrically with respect to the filter unit, and wherein the first matching circuit and the second matching circuit include a circuit comprising:
the inductor connected between the transmission line and ground, and
the capacitor connected between the transmission line and ground.

2. The frequency-variable filter according to claim 1, wherein a frequency change of a real number component of a simultaneous conjugate matching impedance of the first matching circuit and the second matching circuit is substantially the same as a frequency change of a real number component of a simultaneous conjugate matching impedance of the filter unit.

3. The frequency-variable filter according to claim 1, wherein an adjustment inductor or an adjustment capacitor is in series with the transmission line.

4. The frequency-variable filter according to claim 1, wherein the frequency-variable resonance circuit includes:
the first variable capacitor connected in series to the piezoelectric resonator;
a second variable capacitor connected in parallel to the piezoelectric resonator; and
at least one of a series inductor connected in series between the piezoelectric resonator and the first variable capacitor and a parallel inductor for a frequency-variable resonance circuit connected in parallel to the piezoelectric resonator.

5. A frequency-variable filter, comprising:
a first input-output terminal;
a second input-output terminal;
a filter unit, connected to between the first input-output terminal and the second input-output terminal, including a frequency-variable resonance circuit, the frequency-variable resonance circuit including a piezoelectric resonator and a variable capacitor connected to the piezoelectric resonator;
a first matching circuit connected between the first input-output terminal and the filter unit, and
a second matching circuit connected between the second input-output terminal and the filter unit, wherein the first matching circuit and the second matching circuit include a π-type circuit comprising:
a first inductor connected in series to a transmission line,
a capacitor connected between ground and a filter unit side of the first inductor, and
a second inductor connected between ground and an input-output terminal side of the first inductor.

6. The frequency-variable filter according to claim 5, wherein a frequency change of a real number component of a simultaneous conjugate matching impedance of the first matching circuit and the second matching circuit is substantially the same as a frequency change of a real number component of a simultaneous conjugate matching impedance of the filter unit.

7. A frequency-variable filter, comprising:
a first input-output terminal;
a second input-output terminal;
a filter unit, connected to between the first input-output terminal and the second input-output terminal, including a frequency-variable resonance circuit, the frequency-variable resonance circuit including a piezoelectric resonator and a variable capacitor connected to the piezoelectric resonator;
a first matching circuit connected between the first input-output terminal and the filter unit, and
a second matching circuit connected between the second input-output terminal and the filter unit, wherein the first matching circuit and the second matching circuit include a π-type circuit comprising:
a first capacitor connected in series to a transmission line,
an inductor connected between ground and a filter unit side of the first capacitor, and
a second capacitor connected between ground and an input-output terminal side of the first capacitor.

8. The frequency-variable filter according to claim 7, wherein a frequency change of a real number component of a simultaneous conjugate matching impedance of the first matching circuit and the second matching circuit is substantially the same as a frequency change of a real number component of a simultaneous conjugate matching impedance of the filter unit.

* * * * *